US010056669B2

(12) United States Patent
Baba et al.

(10) Patent No.: US 10,056,669 B2
(45) Date of Patent: Aug. 21, 2018

(54) TRANSMISSION LINE

(71) Applicant: Murata Manufacturing Co., Ltd., Nagaokakyo-shi, Kyoto-fu (JP)

(72) Inventors: Takahiro Baba, Nagaokakyo (JP); Yuki Wakabayashi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/370,230

(22) Filed: Dec. 6, 2016

(65) Prior Publication Data

US 2017/0084975 A1    Mar. 23, 2017

Related U.S. Application Data

(63) Continuation of application No. PCT/JP2015/064686, filed on May 22, 2015.

(30) Foreign Application Priority Data

Jun. 16, 2014 (JP) ................................ 2014-123556
Feb. 27, 2015 (JP) ................................ 2015-037787

(51) Int. Cl.
*H01P 3/08* (2006.01)
*H01P 3/18* (2006.01)
(Continued)

(52) U.S. Cl.
CPC ............... *H01P 3/08* (2013.01); *H01P 3/085* (2013.01); *H01P 3/088* (2013.01); *H01P 3/18* (2013.01);
(Continued)

(58) Field of Classification Search
CPC .. H01P 3/08; H01P 3/081; H01P 3/082; H01P 3/085; H01P 3/088
(Continued)

(56) References Cited

U.S. PATENT DOCUMENTS

| 2014/0048312 A1 | 2/2014 | Kato et al. |
| 2014/0133114 A1 | 5/2014 | Saji et al. |

FOREIGN PATENT DOCUMENTS

| JP | 02-268484 A | 11/1990 |
| JP | 06-204715 A | 7/1994 |

(Continued)

OTHER PUBLICATIONS

Official Communication issued in International Patent Application No. PCT/JP2015/064686, dated Aug. 11, 2015.

*Primary Examiner* — Stephen E Jones
(74) *Attorney, Agent, or Firm* — Keating & Bennett, LLP

(57) ABSTRACT

A transmission line includes a dielectric base body including stacked dielectric layers. A first signal conductor, a second signal conductor, and a ground conductor are included inside the dielectric base body. The first signal conductor includes a first end portion signal conductor and a second end portion signal conductor, which are two end portions in a transmitting direction, and a signal conductor that defines and functions as a main conductor portion. A signal conductor of the second signal conductor and the main conductor portion are provided on different dielectric layers. The signal conductor of the second signal conductor and the signal conductor of the first signal conductor are formed on the same dielectric layer. The ground conductor has an increased width and is located between the signal conductor of the second signal conductor and the main conductor portion in a stacking direction.

19 Claims, 9 Drawing Sheets

(51) Int. Cl.
*H05K 1/02* (2006.01)
*H05K 3/46* (2006.01)

(52) U.S. Cl.
CPC ............ *H05K 1/02* (2013.01); *H05K 1/0219* (2013.01); *H05K 3/4685* (2013.01); *H05K 2201/09236* (2013.01); *H05K 2201/09272* (2013.01); *H05K 2201/09618* (2013.01); *H05K 2201/09672* (2013.01)

(58) Field of Classification Search
USPC .............................. 333/1, 4, 5, 33, 238, 246
See application file for complete search history.

(56) References Cited

FOREIGN PATENT DOCUMENTS

| | | | |
|---|---|---|---|
| JP | 2005-033552 | A | 2/2005 |
| JP | 2009-124475 | A | 6/2009 |
| JP | 4962660 | B2 | 6/2012 |
| JP | 5352019 | B1 | 11/2013 |

Fig.6
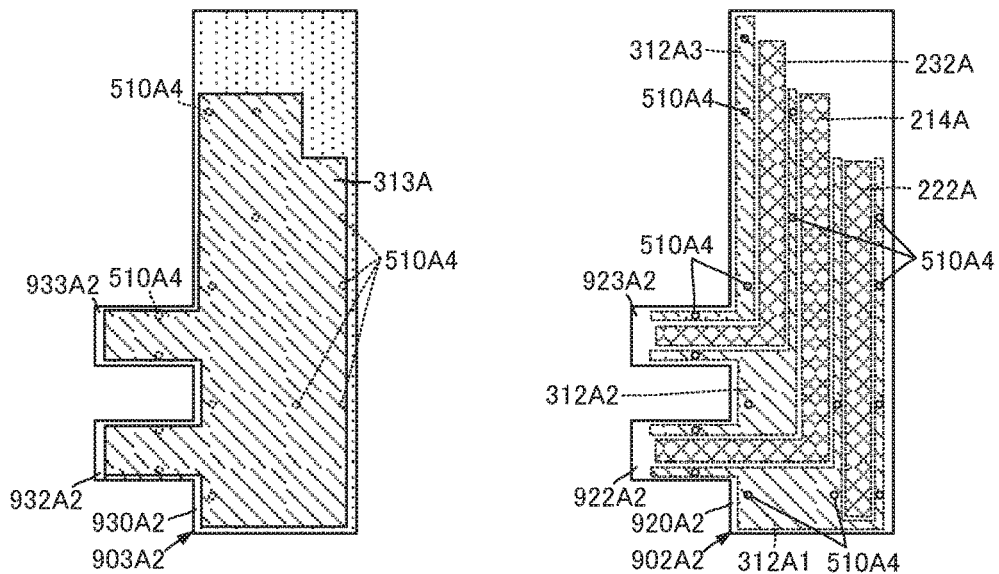
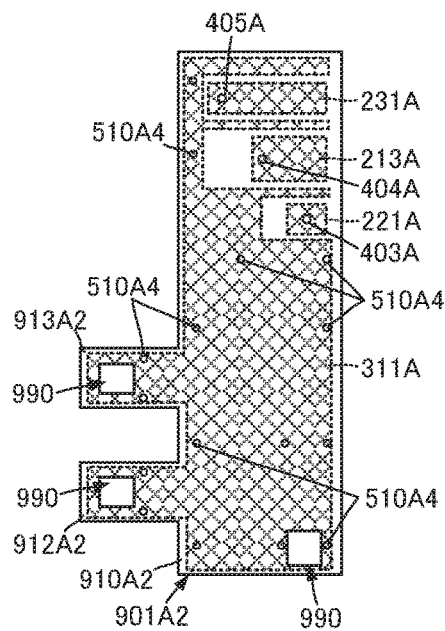
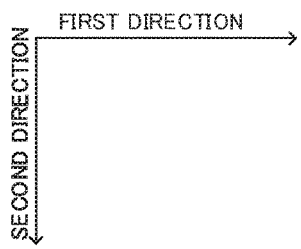

TRANSMISSION LINE

CROSS REFERENCE TO RELATED APPLICATIONS

This application claims the benefit of priority to Japanese Patent Application No. 2014-123556 filed on Jun. 16, 2014 and Japanese Patent Application No. 2015-037787 filed on Feb. 27, 2015 and is a Continuation application of PCT Application No. PCT/JP2015/064686 filed on May 22, 2015. The entire contents of each application are hereby incorporated herein by reference.

BACKGROUND OF THE INVENTION

1. Field of the Invention

The present invention relates to transmission lines in which signal conductors are closely arranged and the signal conductors transmit a plurality of high frequency signals of different types.

2. Description of the Related Art

In prior art, various types of transmission lines are developed for transmitting high frequency signals. For example, a transmission line described in Japanese Patent No. 4962660 has a stripline structure. The transmission line described in the Japanese Patent No. 4962660 includes an elongated dielectric base body, a signal conductor, a first ground conductor, and a second ground conductor. In the dielectric base body, the signal conductor is disposed at a midway location in a thickness direction. The first ground conductor and the second ground conductor are arranged so as to have the signal conductor between them in the thickness direction of the dielectric base body.

Furthermore, the first ground conductor and the second conductor are connected by a plurality of via-hole conductors (interlayer connection conductors) arranged along the signal conductor. This configuration provides a transmission line having a stripline structure in which the signal conductor is interposed between the first and second ground conductors.

When a plurality of transmission lines having the configuration described in Japanese Patent No. 4962660 is closely arranged inside a communication device and the like, it is conceivable, for example, to arrange the plurality of signal conductors on a single dielectric base body. In this arrangement, the plurality of signal conductors may be arranged along a direction perpendicular or substantially perpendicular to the thickness direction of the dielectric base body with space between the signal conductors.

In other words, it is conceivable to have a configuration in which the transmission lines each having the structure described in Japanese Patent No. 4962660 are placed side by side along the direction perpendicular or substantially perpendicular to the thickness direction of the dielectric base body.

However, along with downsizing of electronic devices to which transmission lines are installed, there is a demand for smaller transmission lines. On the other hand, in a case that neighboring signal conductors are placed too close, coupling occurs between these signal conductors. For example, in the case that the foregoing configuration is used, the distance between the signal conductors becomes shorter if the width of the transmission line is made narrower, causing the coupling to occur more easily between the signal conductors. As a result, isolation between the transmission lines each having such signal conductors decreases.

SUMMARY OF THE INVENTION

Accordingly, preferred embodiments of the present invention provide a small transmission line that suppresses coupling between a plurality of transmission lines.

A transmission line according to a preferred embodiment of the present invention includes a dielectric base body including a plurality of dielectric layers stacked in a stacking direction, a first signal conductor and a second signal conductor that are disposed in the dielectric base body and transmit high frequency signals, and a first ground conductor.

The first signal conductor includes a first signal main conductor portion, a first end portion connected to one end of the first signal main conductor portion, and a second end portion connected to another end of the first signal main conductor portion. The second signal conductor includes a second signal main conductor portion, a third end portion connected to one end of the second signal main conductor portion, and a fourth end portion connected to another end of the second signal main conductor portion. The second signal main conductor portion lines up with the first signal main conductor portion at a layer position different from a layer position of the first signal main conductor portion in the stacking direction. The third end portion and the first end portion are provided on the same layer in the stacking direction. The first end portion and the first signal main conductor portion are provided at different layer positions in the stacking direction and connected to each other by a first interlayer connection conductor for a signal conductor. The first ground conductor is arranged between the first signal main conductor portion and the second signal main conductor portion in the stacking direction and has a width wider than widths of the first signal main conductor portion and the second signal main conductor portion.

In this configuration, the first signal main conductor portion of the first signal conductor and the second signal main conductor portion of the second signal conductor are arranged side by side in the stacking direction of the dielectric base body, and isolation is secured by the first ground conductor. On the other hand, the thickness may be reduced at a region where the first end portion and the third end portion are provided in the dielectric base body.

Preferably, a transmission line according to a preferred embodiment of the present invention is configured as follows. The second signal main conductor portion, the third end portion, the fourth end portion, the first end portion of the first signal conductor, and the second end portion of the first signal conductor are provided at the same layer position in the stacking direction. The second end portion and the first signal main conductor portion are connected to each other by a second interlayer connection conductor for a signal conductor.

In this configuration, the thickness may be reduced also at a region where the second end portion and the fourth end portion are provided in the dielectric base body.

Preferably, a transmission line according to a preferred embodiment of the present invention is configured as follows. The dielectric base body includes a first portion where the first signal main conductor portion overlaps the second signal main conductor portion in the stacking direction, and a second portion where the first end portion, the second end portion, the third end portion, and the fourth end portion are disposed. The second portion includes at least a portion whose thickness in the stacking direction is thinner than the thickness of the first portion.

In this configuration, flexibility may be improved at both end portions of the dielectric base body in a transmission direction.

Preferably, a transmission line according to a preferred embodiment of the present invention is configured as follows. The transmission line further includes a third signal conductor provided at the same layer position as that of the second signal main conductor portion in the stacking direction. The second signal main conductor portion, the third end portion, and the fourth end portion are provided at the same layer position in the stacking direction. In-layer ground conductors are provided between the third signal conductor and the second signal main conductor portion at the first portion, between the third signal conductor and the first end portion and the third end portion at the second portion, and between the third signal conductor and the second end portion and the fourth end portion at the second portion.

In this configuration, the isolation between signal conductors may be secured even at the second portion, that is, the portion where a plurality of signal conductors are lined up side by side at the same layer. Furthermore, the thickness of the first portion may be reduced.

Preferably, in a transmission line according to a preferred embodiment of the present invention, at least a portion of the plurality of dielectric layers includes an insulating base material having a different thickness at the first portion and the second portion.

In this configuration, desired impedances are easily achieved in both the first portion and the second portion. This makes it possible to provide the transmission line with less transmission loss.

Preferably, a transmission line according to a preferred embodiment of the present invention is configured as follows. The transmission line further includes at least one of a second ground conductor and a third ground conductor. The second ground conductor is disposed on a side opposite to the first ground conductor with reference to the first signal main conductor portion in the stacking direction. The third ground conductor disposed on a side opposite to the first ground conductor with reference to the second signal main conductor portion in the stacking direction.

In this configuration, it is possible to significantly reduce or prevent noise radiation to outside from the first signal conductor and superimposition of outside noise in the first signal conductor at the first portion and to significantly reduce or prevent noise radiation to outside from the second signal conductor and superimposition of outside noise in the second signal conductor at the first portion.

Preferably, a transmission line according to a preferred embodiment of the present invention is configured as follows. The transmission line further includes a fourth ground conductor arranged between the first end portion and the second signal main conductor portion.

In this configuration, the isolation between the first signal conductor and the second signal conductor is improved.

Preferably, in a transmission line according to a preferred embodiment of the present invention, the fourth ground conductor has a shape surrounding the first end portion.

In this configuration, the ground of the first end portion of the first signal conductor is strengthened.

Preferably, a transmission line according to a preferred embodiment of the present invention is configured as follows. The transmission line further includes a fourth ground conductor arranged between the first end portion and the second signal main conductor portion and a fifth ground conductor arranged between the second end portion and the second signal main conductor portion.

In this configuration, the isolation between the first signal conductor and the second signal conductor is further improved.

Preferably, in a transmission line according to a preferred embodiment of the present invention, the fourth ground conductor has a shape surrounding the first end portion, and the fifth ground conductor has a shape surrounding the second end portion.

In this configuration, the grounds of the first end portion and the second end portion of the first signal conductor are strengthened.

Preferably, in a transmission line according to a preferred embodiment of the present invention, the shape of the fourth ground conductor surrounds the third end portion, and the shape of the fifth ground conductor surrounds the fourth end portion.

In this configuration, the grounds of the third end portion and the fourth end portion of the second signal conductor are strengthened.

Preferably, a transmission line according to a preferred embodiment of the present invention further includes a third interlayer connection conductor connecting the first ground conductor and the fourth ground conductor or the fifth ground conductor.

In this configuration, the isolation between the first signal conductor and the second signal conductor is further improved.

According to various preferred embodiments of the present invention, small transmission lines that significantly reduces or prevents coupling between a plurality of transmission lines are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is an exploded plan view of a second portion of the transmission line according to the second preferred embodiment of the present invention.

DETAILED DESCRIPTION OF THE PREFERRED EMBODIMENTS

First Preferred Embodiment

Figure 1:
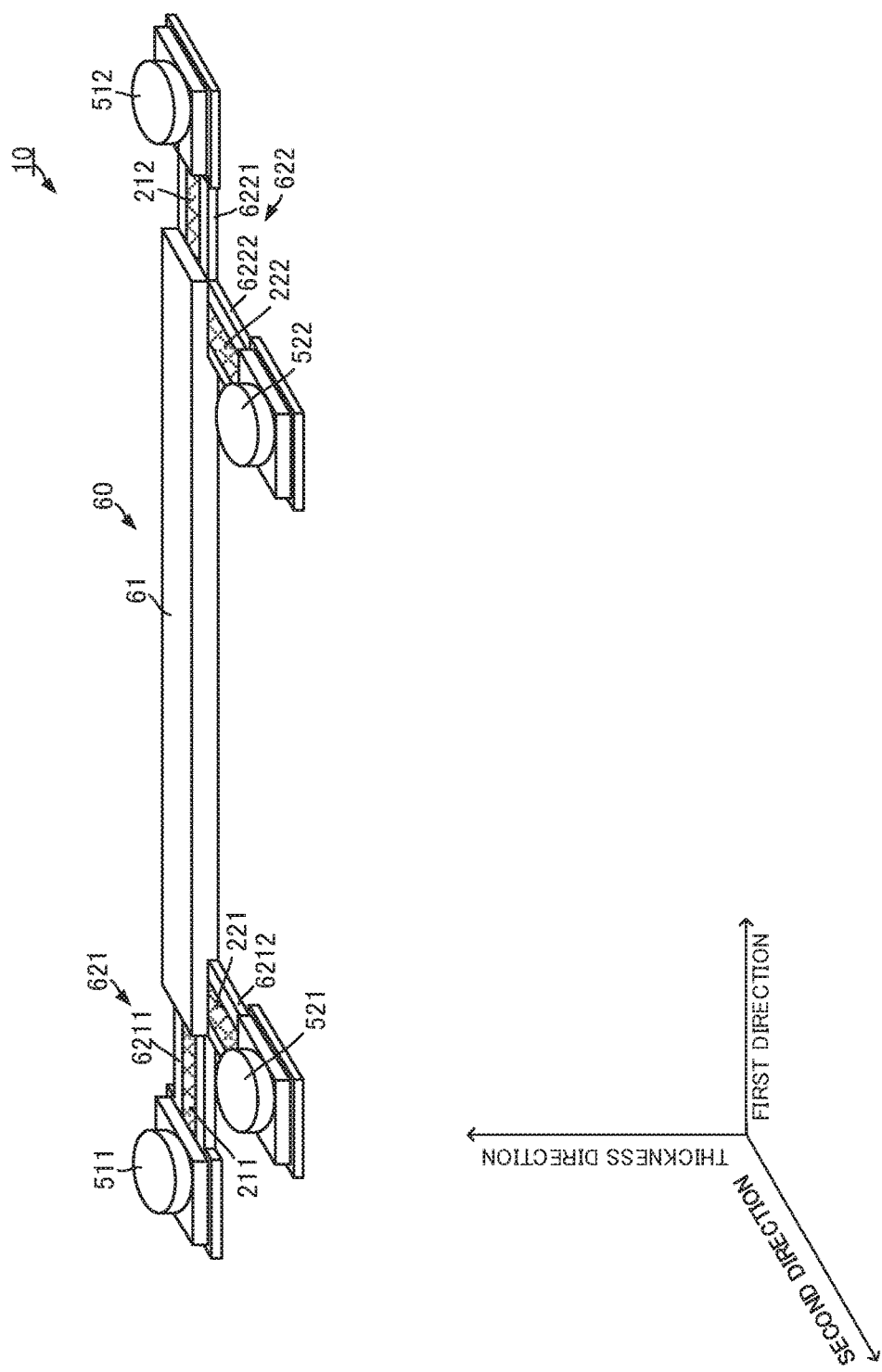
FIG. 1 is an external perspective view of a transmission line according to a first preferred embodiment of the present invention.
Figure 2:
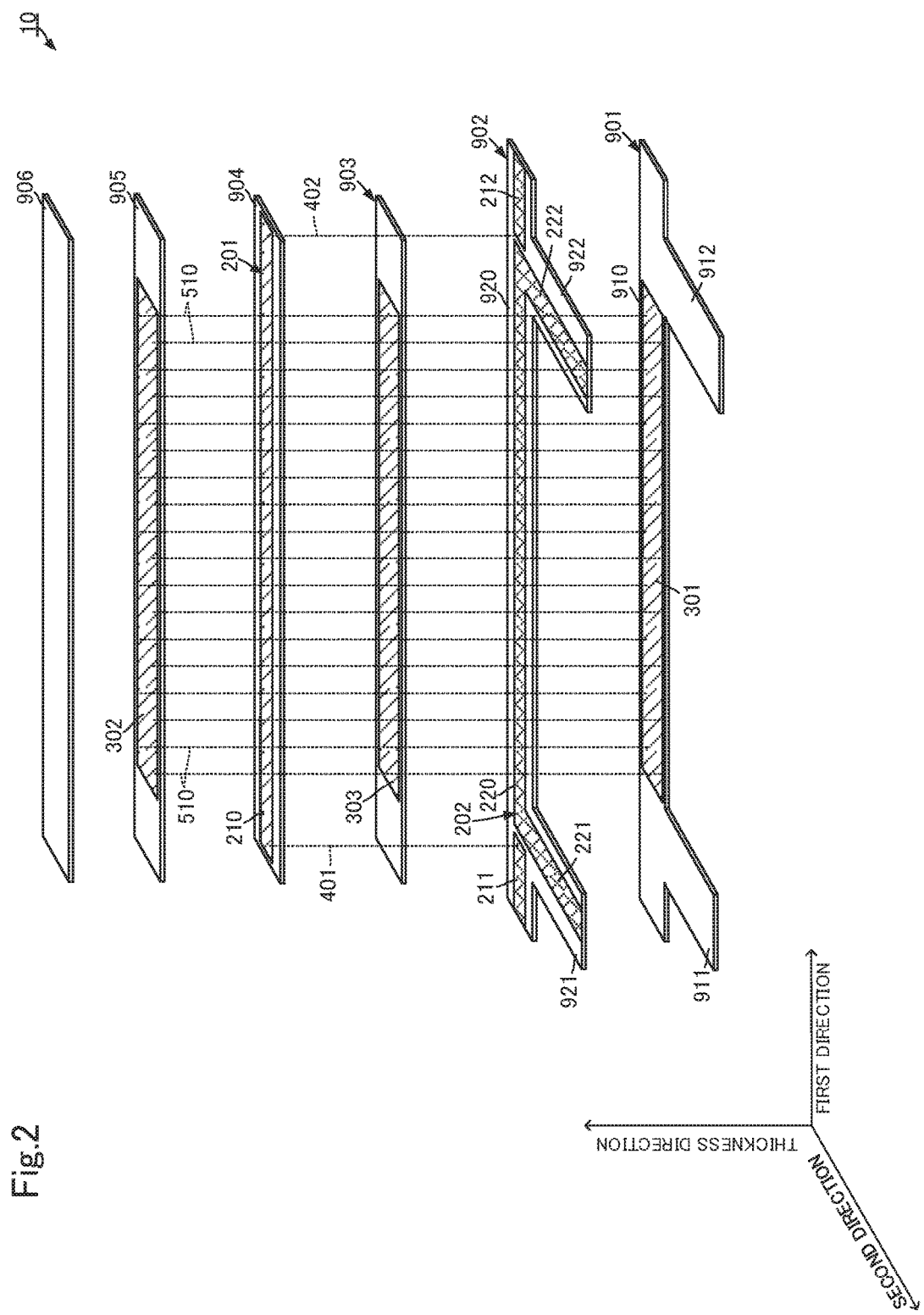
FIG. 2 is an exploded perspective view of the transmission line according to the first preferred embodiment of the present invention.
Figure 3:
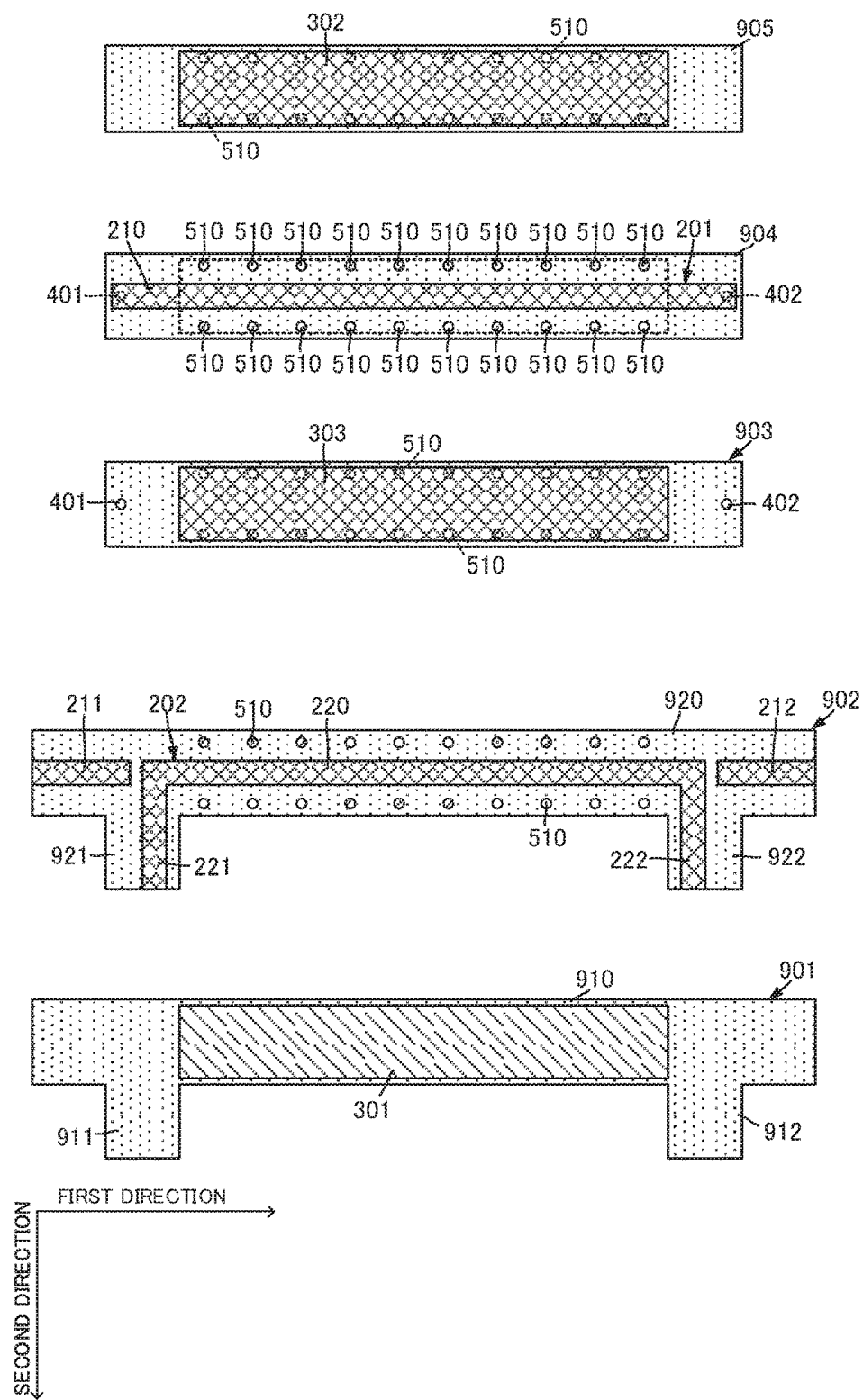
FIG. 3 is an exploded plan view of the transmission line according to the first preferred embodiment of the present invention.

A transmission line according to a first preferred embodiment of the present invention is described with reference to the drawings. FIG. 1 is an external perspective view of the transmission line according to the first preferred embodiment of the present invention. FIG. 2 is an exploded perspective view of the transmission line according to the first preferred embodiment of the present invention. FIG. 3 is an exploded plan view of the transmission line according to the first preferred embodiment of the present invention.

As depicted in FIG. 1, a transmission line 10 includes a dielectric base body 60 having a plate shape and including a plurality of dielectric layers 901, 902, 903, 904, 905, and 906. In the dielectric base body 60, a first portion 61 and second portions 621 and 622 are provided together. The first portion 61 has an elongated shape extending in a first direction. The second portion 621 is disposed at one end portion of the first portion 61 in the first direction (elongated direction). The second portion 622 is disposed at the other end portion of the first portion 61 in the first direction (elongated direction). The length of the first portion 61 in a transmission direction is longer than the lengths of the second portions 621 and 622 in the transmission direction.

The second portion 621 includes a line member 6211 extending in the first direction and a line member 6212 extending in a second direction (width direction) perpendicular or substantially perpendicular to the first direction. On the line member 6211, a signal conductor 211 is provided. On the line member 6212, a signal conductor 221 is provided.

A connector 511 connected to the signal conductor 211 is connected at one end portion of the line member 6211, which is the end portion opposite to an end portion of the line member 6211 connected to the first portion 61. A connector 521 connected to the signal conductor 221 is connected at one end portion of the line member 6212, which is the end portion opposite to an end portion of the line member 6212 connected to the first portion 61.

The second portion 622 includes a line member 6221 extending in the first direction and a line member 6222 extending in the second direction (width direction) perpendicular or substantially perpendicular to the first direction. On the line member 6221, a signal conductor 212 is provided. On the line member 6222, a signal conductor 222 is provided.

A connector 512 connected to the signal conductor 212 is connected at one end portion of the line member 6221, which is the end portion opposite to an end portion of the line member 6221 connected to the first portion 61. A connector 522 connected to the signal conductor 222 is connected at one end portion of the line member 6222, which is the end portion opposite to an end portion of the line member 6222 connected to the first portion 61.

Specifically, the dielectric base body 60 has a configuration depicted in FIG. 2 and FIG. 3. The dielectric layer 901 includes a region 910 corresponding to the first portion and regions 911 and 912 corresponding to the second portion. Over substantially the entire area of a surface of the region 910 of the dielectric layer 901, a ground conductor 301 is provided. The ground conductor 301 corresponds to a "third ground conductor".

A surface of the dielectric layer 902 includes a region 920 corresponding to the first portion and regions 921 and 922 corresponding to the second portion. A signal conductor 220 having a shape extending in the first direction is provided at the region 920.

Signal conductors 211 and 221 are provided at the region 921. The signal conductor 211 is provided at a sub-region of the region 921, which extends in the first direction, and is separated from the signal conductor 220. The signal conductor 221 is provided at a sub-region of the region 921, which extends in the second direction, and is connected to the signal conductor 220.

The signal conductors 212 and 222 are provided at the region 922. The signal conductor 212 is provided at a sub-region of the region 922, which extends in the first direction, and is separated from the signal conductor 220. The signal conductor 222 is provided at a sub-region of the region 922, which extends in the second direction, and connected to the signal conductor 220.

A signal conductor 202 includes the signal conductors 220, 221, and 222 corresponds to a "second signal conductor". Furthermore, the signal conductor 220 corresponds to a "second signal main conductor portion", the signal conductor 221 corresponds to a "third end portion", and the signal conductor 222 corresponds to a "fourth end portion".

The dielectric layers 903, 904, 905, and 906 each include only a region corresponding to the first portion.

A ground conductor 303 is provided on substantially the entire area of a surface of the dielectric layer 903 except areas near both end portions of the dielectric layer 903 in the first direction. The ground conductor 303 corresponds to a "first ground conductor".

A signal conductor 210 having a shape extending in the first direction is provided on a surface of the dielectric layer 904. One end portion of the signal conductor 210 is connected to the signal conductor 211 via an interlayer connection conductor 401 for signal conductor. The other end portion of the signal conductor 210 is connected to the signal conductor 212 via an interlayer connection conductor 402 for signal conductor. A signal conductor 201 including the signal conductors 210, 211, and 212 corresponds to a "first signal conductor". Furthermore, the signal conductor 210 corresponds to a "first signal main conductor portion", the signal conductor 211 corresponds to a "first end portion", and the signal conductor 212 corresponds to a "second end portion". The signal conductor 210 and the signal conductors 211 and 212 may alternatively be capacitively coupled without using the interlayer connection conductors 401 and 402. In this case, the capacitively coupled portion may also be used as a filter.

A ground conductor 302 is provided on substantially the entire area of a surface of the dielectric layer 905 except areas near both end portions of the dielectric layer 905 in the first direction. The ground conductor 302 corresponds to a "second ground conductor".

No conductor pattern is provided on the dielectric layer 906. The dielectric layer 906 is located on the side of the dielectric layer 905 at which the ground conductor 302 is provided.

The ground conductors 301, 302, and 303 are connected to each other via a plurality of interlayer connection conductors 510 for grounding. The plurality of interlayer connection conductors 510 for grounding are located near both end portions of the first portion 61 in the second direction with a predetermined interval along the first direction.

According to such a structure, at the first portion 61, a stripline transmission line is provided in which the signal conductor 210 is interposed between the ground conductors 303 and 302 in a stacking direction of the dielectric layers (thickness direction of the dielectric base body 60). Furthermore, at the first portion 61, a stripline transmission line is provided in which the signal conductor 202 is interposed between the ground conductors 303 and 301 in the stacking direction of the dielectric layers (thickness direction of the dielectric base body 60).

This makes it possible to provide, at the first portion 61, a structure in which the first transmission line including the signal conductor 210 and the second transmission line including the signal conductor 220 are located side by side in close proximity in the stacking direction. Furthermore, the isolation between the signal conductor 210 and the signal conductor 220 is secured by arranging between the signal conductor 210 and the signal conductor 220 the ground conductor 303 that has the width wider than the widths of these signal conductors 210 and 220. Furthermore, the width of the first portion 61 may be made narrower since there is no need to line up the signal conductor 210 and the signal conductor 220 on the same layer side by side in the second direction.

Furthermore, according to such a structure, at the second portion 621, the signal conductor 211 defining the first transmission line and the signal conductor 221 defining the second transmission line are provided at the same layer. This makes it possible to reduce the thickness of the second portion 621. Similarly, at the second portion 622, the signal conductor 212 defining the first transmission line and the signal conductor 222 defining the second transmission line are provided at the same layer. This makes it possible to reduce the thickness of the second portion 622. Furthermore, the second transmission line including the signal conductors 220, 221, and 222 does not include any interlayer connection conductor. Accordingly, the second transmission line may transmit a signal without the interlayer connection conductor that is likely to cause transmission loss, thus making it possible to execute good signal transmission without loss.

Thus, flexibility is improved at both end portions of the dielectric base body 60 in the signal transmission direction. In order to do that, the longer length of the first portion 61 than that of the second portions 622 and 623 is utilized to increase the transmission distance of high frequency signal, thus improving the flexibility only at short portion near both the end portions in the transmission direction. Furthermore, at the first portion 61, the isolation between the first transmission line and the second transmission line are highly secured, making it possible to provide the transmission line 10 having excellent transmission characteristics.

The impedance of the first transmission line is determined as follows. The shape is determined in such a way that, for example, the impedance of the first transmission line becomes about 55Ω, a little higher than about 50Ω, by using the signal conductor 210 and the ground conductor 303. Next, the shape is determined in such a way that the impedance of the first transmission line becomes about 50Ω, for example, by using the ground conductor 302.

Similarly, the impedance of the second transmission line is determined as follows. The shape is determined in such a way that, for example, the impedance of the second transmission line becomes about 55Ω, a little higher than about 50Ω, by using the signal conductor 220 and the ground conductor 303. Next, the shape is determined in such a way that the impedance of the second transmission line becomes about 50Ω, for example, by using the ground conductor 301.

It is possible to omit the ground conductors 301 and 302. In such case, the interlayer connection conductors 510 may also be omitted. The ground conductors 301 and 302 may alternatively be provided with no-conductor portions (opening portions). Such opening portions may be provided along the first direction with a certain interval. However, as described in the present preferred embodiment, inclusion of the ground conductors 301 and 302 and the interlayer connection conductors 510 makes it possible to suppress high frequency noise radiation to external environment as well as noise coming from the external environment. This is more preferable for the transmission line.

The transmission line 10 having such structure may be fabricated, for example, in the following manner.

First, a dielectric film (corresponding to the dielectric layer) having copper cladding over the entire surface at one side is prepared. In the present preferred embodiment, liquid crystal polymer is used as the dielectric film.

The first ground conductor 301 is formed on a surface of a first dielectric film (corresponding to the dielectric layer 901) by patterning and the like. The signal conductors 220, 211, 212, 221, and 222 are formed on a surface of a second dielectric film (corresponding to the dielectric layer 902) by patterning and the like. The ground conductor 303 is formed on a surface of a third dielectric film (corresponding to the dielectric layer 903) by patterning. The signal conductor 210 is formed on a surface of a fourth dielectric film (corresponding to the dielectric layer 904) by patterning and the like. The ground conductor 302 is formed on a surface of a fifth dielectric film (corresponding to the dielectric layer 905) by patterning and the like. A sixth dielectric film (corresponding to the dielectric layer 906), on which no conductor is formed, is prepared.

Next, through holes are formed by directing a laser beam to predetermined locations of a plurality of the dielectric films, and conductor portions are formed by filling the through holes with electrically conductive paste. These conductor portions serve as bases for the interlayer connection conductors 401 and 402 for signal conductor and the interlayer connection conductors 510 for grounding.

Next, the plurality of the dielectric films are stacked and subjected to thermocompression bonding to form an integrated structure. This integrated structure is then cut into individual pieces. Each of the individual pieces defines the dielectric base body 60. During this process, the electrically conductive paste is solidified, and the interlayer connection conductors 401 and 402 for signal conductor and the interlayer connection conductors 510 for ground are formed. As described above, the interlayer connection conductors 401, 402, and 510 are formed using conductive paste (so-called the interlayer connection conductor with via-hole conductor). This is a convenient process since the thermocompression bonding process of the dielectric base body 60 may be utilized. Alternatively, the interlayer connection conductors 401, 402, and 510 may be replaced with through holes that are formed by making through holes on the dielectric base body 60 and plating inside the through holes. Furthermore, the interlayer connection conductors such as the interlayer connection conductors 510 at the end portion may be alternatively formed by plating the side surface of the dielectric base body 60 (surface interposed between the top surface and the bottom surface of the dielectric base body 60). In this case, a gap between the interlayer connection conductor 510 and the signal conductor 201 may be made wider, compared with the interlayer connection conductors formed using the via-hole conductor, making it possible to widen the line width of the signal conductor 201. This makes it possible to reduce conductor loss of the signal conductor 201.

Next, the connectors 511, 512, 521, and 522 are mounted at both end portions of the dielectric base body 60 in an elongated direction.

Second Preferred Embodiment

Figure 4:
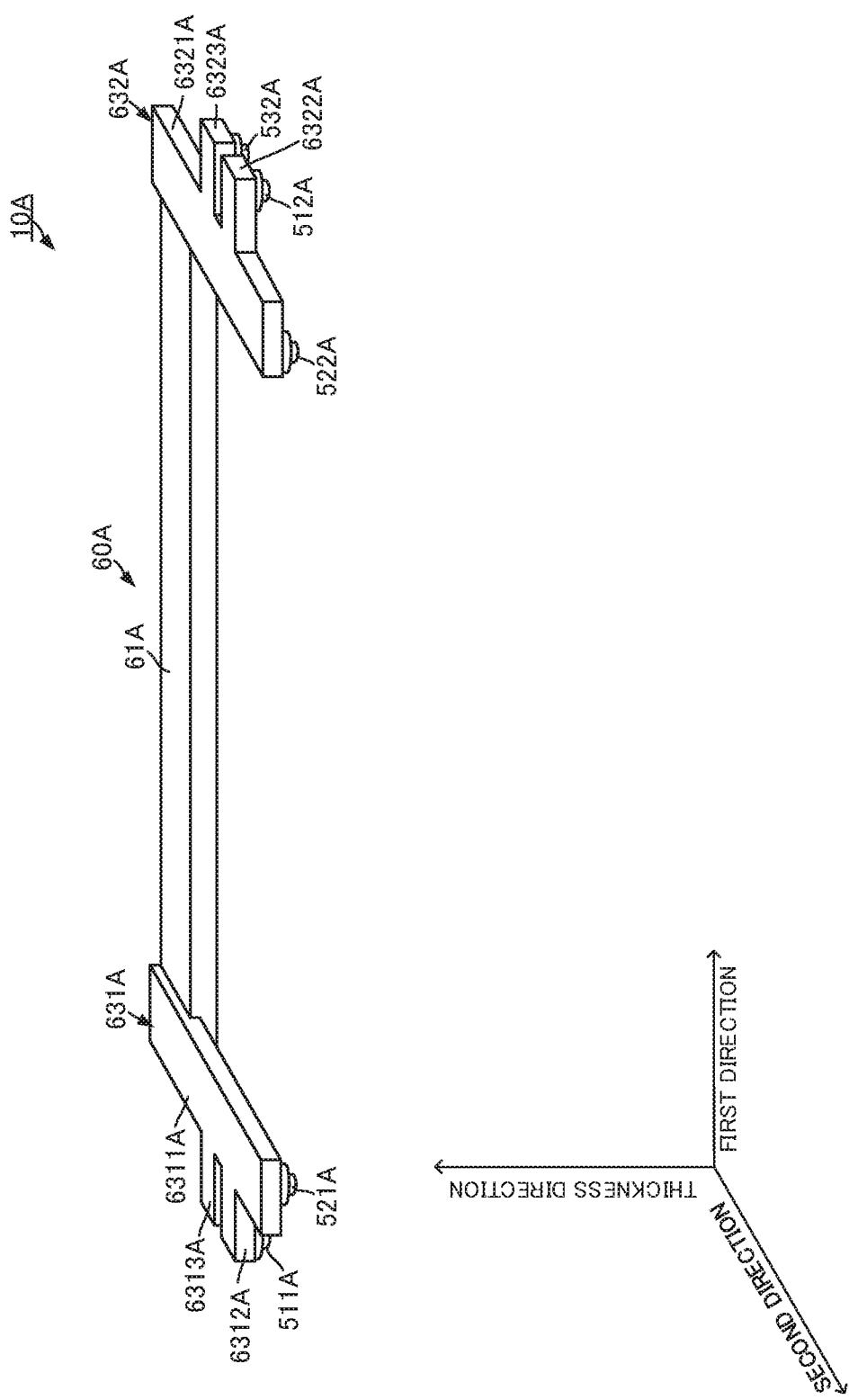
FIG. 4 is an external perspective view of a transmission line according to a second preferred embodiment of the present invention.
Figure 5:
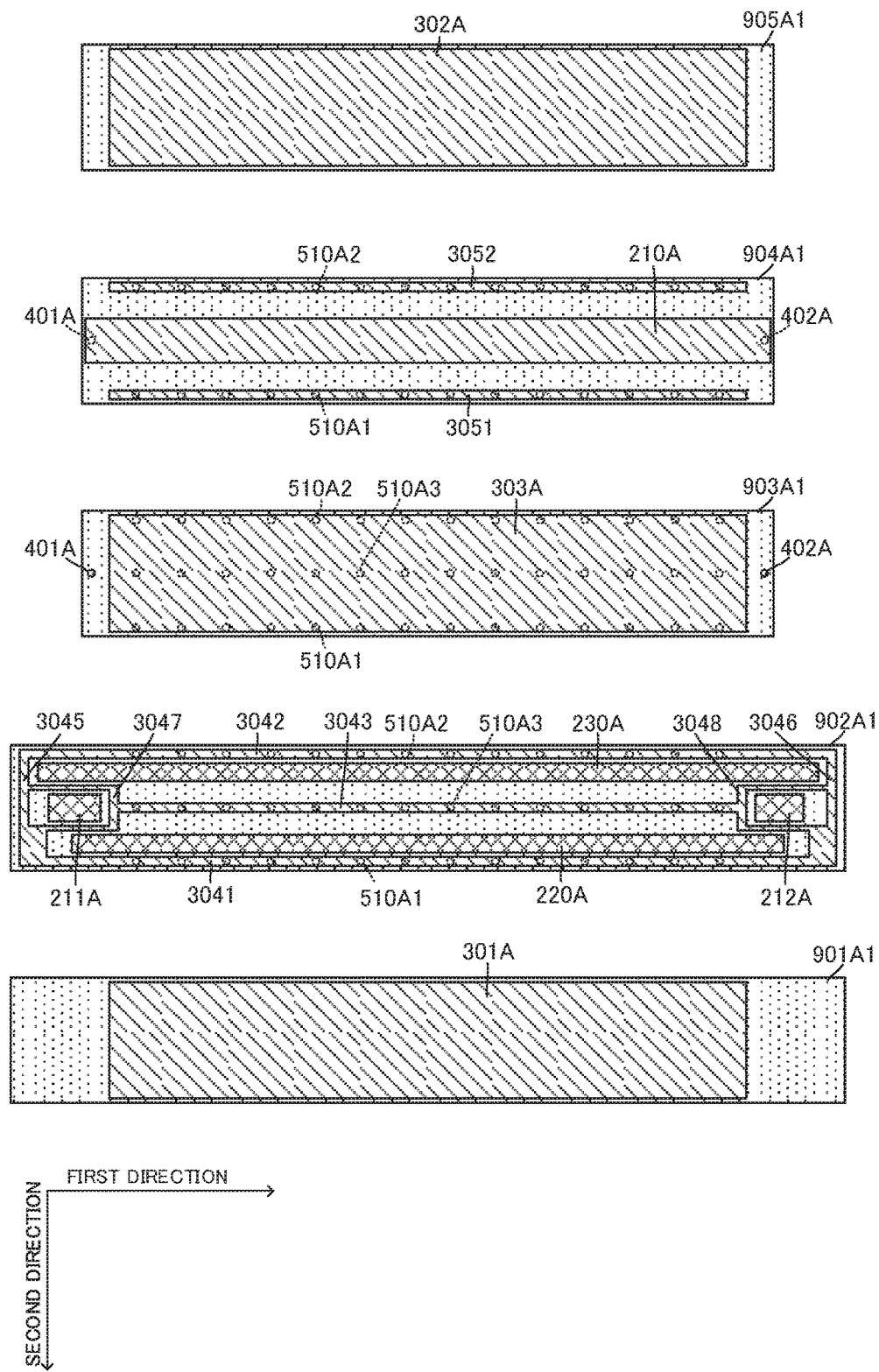
FIG. 5 is an exploded plan view of a first portion of the transmission line according to the second preferred embodiment of the present invention.
Figure 7:
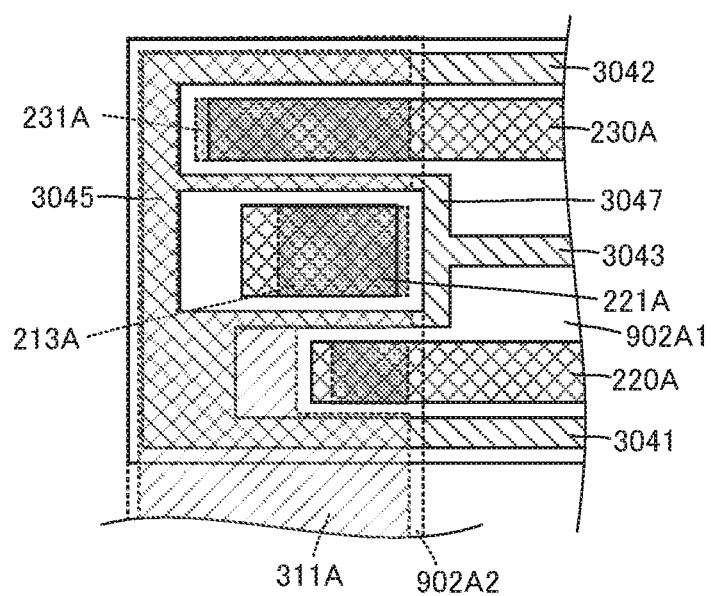
FIG. 7 is a transparent plan view of a joining portion of the first portion and the second portion of the transmission line according to the second preferred embodiment of the present invention.

Next, a transmission line according to a second preferred embodiment of the present invention is described with reference to the drawings. FIG. 4 is an external perspective view of the transmission line according to the second preferred embodiment of the present invention. FIG. 5 is an exploded plan view of a first portion of the transmission line according to the second preferred embodiment of the present invention. FIG. 6 is an exploded plan view of a second portion of the transmission line according to the second preferred embodiment of the present invention. FIG. 7 is a transparent plan view of a joining portion of the first portion and the second portion of the transmission line according to the second preferred embodiment of the present invention.

As depicted in FIG. 4, a transmission line 10A includes a dielectric base body 60A. The dielectric base body 60A is formed preferably by joining a first portion 61A and second portions 631A and 632A, which are individually formed. The first portion 61A has an elongated shape extending in the first direction. The second portion 631A is joined to one end portion of the first portion 61A in the first direction (elongated direction). The second portion 632A is joined to the other end portion of the first portion 61A in the first direction (elongated direction).

The second portion 631A includes line members 6311A, 6312A, and 6313A. The line member 6311A has a shape extending in the second direction and is joined to the first portion 61A at one end portion thereof in an extending direction. A connector 521A is connected at the other end portion of the line member 6311A in the extending direction. Furthermore, on the other end portion side of the line member 6311A in the extending direction, the line members 6312A and 6313A extending in the first direction preferably are integrally formed with the line member 6311A. The connector 511A is connected to the line member 6312A, and a connector not shown in the figure is connected to the line member 6313A.

The second portion 632A includes line members 6321A, 6322A, and 6323A. The line member 6321A has a shape extending in the second direction and is joined to the first portion 61A at one end portion thereof in an extending direction. A connector 522A is connected at the other end portion of the line member 6321A in the extending direction. Furthermore, on the other end portion side of the line member 6321A in the extending direction, the line members 6322A and 6323A extending in the first direction preferably are integrally formed. The connector 512A is connected to the line member 6322A, and a connector 532A is connected to the line member 6323A.

As depicted in FIG. 5, the first portion 61A is formed preferably by stacking elongated dielectric layers 901A1, 902A1, 903A1, 904A1, and 905A1, each extending in the first direction.

A ground conductor 301A is formed on substantially the entire area of the dielectric layer 901A1.

Signal conductors 211A, 212A, 220A, and 230A and ground conductors 3041, 3042, 3043, 3045, 3046, 3047, and 3048 are formed on the dielectric layer 902A1. The signal conductors 220A and 230A each have an elongated shape extending in the first direction. The signal conductor 220A is formed near one end portion of the dielectric layer 902A1 in the second direction. The signal conductor 230A is formed near the other end portion of the dielectric layer 902A1 in the second direction.

The signal conductors 211A and 212A are formed at a region of the dielectric layer 902A1 between the signal conductors 220A and 230A in the second direction. The signal conductors 211A and 212A are rectangular or substantially rectangular in shape. The signal conductor 211A is formed near one end portion of the dielectric layer 902A1 in the first direction. The signal conductor 212A is formed near the other end portion of the dielectric layer 902A1 in the first direction.

The ground conductor 3041 has an elongated shape extending in the first direction and is formed between the signal conductor 220A and one end portion of the dielectric layer 902A1 in the second direction. The ground conductor 3042 has an elongated shape extending in the first direction and is formed between the signal conductor 230A and the other end portion of the dielectric layer 902A1 in the second direction. The ground conductor 3041 is connected to the ground conductor 3045 at one end portion and connected to the ground conductor 3046 at the other end portion.

The ground conductor 3043 has an elongated shape extending in the first direction and is formed between the signal conductors 220A and 230A in the second direction. Furthermore, the ground conductor 3043 is formed between the signal conductors 211A and 212A in the first direction.

The ground conductor 3045 has an elongated shape extending in the second direction and is formed between the signal conductor 211A and one end portion of the dielectric layer 902A1 in the first direction. The ground conductor 3046 has an elongated shape extending in the second direction and is formed between the signal conductor 212A and the other end portion of the dielectric layer 902A1 in the first direction. The ground conductors 3045 and 3046 are connected to the ground conductor 3042.

The ground conductor 3047 has a shape surrounding the signal conductor 211A. The ground conductor 3047 is connected to the ground conductors 3045 and 3043. The ground conductor 3048 is has a shape surrounding the signal conductor 212A. The ground conductor 3048 is connected to the ground conductors 3046 and 3043.

A ground conductor 303A is formed on substantially the entire area of the dielectric layer 903A1.

The signal conductor 210A and the ground conductors 3051 and 3052 are formed on the dielectric layer 904A1. The signal conductor 210A has an elongated shape extending in the first direction. The signal conductor 210A is disposed at substantially a center location of the dielectric layer 904A1 in the second direction.

The ground conductor 3051 has an elongated shape extending in the first direction and is formed between the signal conductor 210A and one end portion of the dielectric layer 904A1 in the second direction. The ground conductor 3052 has an elongated shape extending in the first direction and is formed between the signal conductor 210A and the other end portion of the dielectric layer 904A1 in the second direction.

A ground conductor 302A is formed on substantially the entire area of the dielectric layer 905A1.

One end portion of the signal conductor 210A in the first direction is connected to the signal conductor 211A via an interlayer connection conductor 401A for signal conductor. The other end portion of the signal conductor 210A in the first direction is connected to the signal conductor 212A via an interlayer connection conductor 402A for signal conductor.

The ground conductors 301A, 302A, 303A, 3041, and 3051 are connected to each other via a plurality of interlayer connection conductors 510A1 arranged along the first direction. The ground conductors 301A, 302A, 303A, 3042, and 3052 are connected to each other via a plurality of interlayer connection conductors 510A2 arranged along the first direction. The ground conductors 301A, 303A, and 3043 are connected to each other via a plurality of interlayer connection conductors 510A3 arranged side by side in the first direction.

At the first portion 61A, such structure allows each of the first transmission line including the signal conductor 210A, the second transmission line including the signal conductor 220A, and the third transmission line including the signal conductor 230A to define a stripline transmission line. Furthermore, the foregoing configuration provides a structure in which the first transmission line is side by side with the second and third transmission lines in close proximity in the stacking direction. Furthermore, the isolation is secured between the signal conductor 210A and the signal conductors 220A and 230A, that is, between the first transmission line and the second and third transmission lines by arranging the ground conductor 303A, which has the width wider than the widths of these signal conductors 210A, 220A, and 230A, between the signal conductor 210A and the signal conductors 220A and 230A. Furthermore, by arranging the ground conductor 3043 between the signal conductor 220A and the signal conductor 230A, which are provided on the same layer, the isolation is secured between the signal conductor 220A and the signal conductor 230A, that is, between the second transmission line and the third transmission line. Based on the above, the width of the first portion 61A may be made narrower as much as possible. Here, it is easier to increase the isolation of the first transmission line provided on a different layer, compared with the isolation of the second transmission line and the third transmission line. Thus, it is preferable to use the first transmission line for a high frequency signal having a low reception signal level, and use the second transmission line and the third transmission line for high frequency signals having at least a certain reception signal level. In addition to the above, by using the configuration in which the ground conductor 3043 is provided between the signal conductor 220A and the signal conductor 230A and the configuration in which the interlayer connection conductors 510A are provided, the isolation is secured between the second transmission line and the third transmission line.

Furthermore, in the structure of the present preferred embodiment, the thickness of the first portion 61A may be made thinner, compared with the structure in which three signal conductors are arranged side by side in the stacking direction. In other words, an increase in the thickness of the first portion 61A is significantly reduced or prevented.

As depicted in FIG. 6, the second portion 631A is formed preferably by stacking elongated dielectric layers 901A2, 902A2, and 903A2, each extending in the first direction. Here, the second portion 631A and the second portion 632A are symmetric in shape. Thus, only the second portion 631A is described below.

The dielectric layer 901A2 includes a region 910A2 corresponding to the line member 6311A, a region 912A2 corresponding to the line member 6312A, and a region 913A2 corresponding to the line member 6313A. A ground conductor 311A, signal conductors 213A, 221A, and 231A are provided on the dielectric layer 901A2.

The signal conductors 213A, 221A, and 231A are located near one end portion of the region 910A2 in the second direction. The signal conductors 213A, 221A, and 231A are rectangular or substantially rectangular in shape. The signal conductors 213A, 221A, and 231A are arranged in the order of the signal conductors 231A, the signal conductors 213A, and the signal conductor 221A from the one end portion of the second direction. The ground conductor 311A is provided on substantially the entire area of the dielectric layer 901A2.

Through holes 990 to provide connector mounting are provided in the regions 912A2, 913A2, and 910A2 near the other end portion of the region 910A2.

The dielectric layer 902A2 includes a region 920A2 corresponding to the line member 6311A, a region 922A2 corresponding to the line member 6312A, and a region 923A2 corresponding to the line member 6313A. Signal conductors 222A, 214A, 232A and ground conductors 312A1, 312A2, 312A3 are formed on the dielectric layer 902A2.

One end portion of the signal conductor 214A is connected to the signal conductor 213A via an interlayer connection conductor 404A. The signal conductor 214A preferably is belt-shaped such that the other end portion thereof overlaps the through hole 990 at the region 912A2.

One end portion of the signal conductor 222A is connected to the signal conductor 221A via an interlayer connection conductor 403A. The signal conductor 222A preferably is belt-shaped such that the other end portion thereof overlaps the through hole 990 at the region 910A2.

One end portion of the signal conductor 232A is connected to the signal conductor 231A via an interlayer connection conductor 405A. The signal conductor 231A preferably is belt-shaped such that the other end portion thereof overlaps the through hole 990 at the region 913A2.

The ground conductor 312A1 surrounds the signal conductor 222A and is interposed between the signal conductors 222A and 214A. The ground conductor 312A2 is provided between the signal conductors 214A and 232A. The ground electrode 312A3 sandwiches the signal conductor 232A with the ground conductor 312A2.

The dielectric layer 903A2 includes a region 930A2 corresponding to the line member 6311A, a region 932A2 corresponding to the line member 6312A, and a region 933A2 corresponding to the line member 6313A. A ground conductor 313A is provided on the dielectric layer 903A2. The ground conductor 313A is provided on substantially the entire area of the dielectric layer 903A2.

The dielectric layers 901A2, 902A2, and 903A2 having such configurations are stacked on top of each other in such a way that a conductor-containing surface of the dielectric layer 902A2 abuts a no-conductor-containing surface of the dielectric layer 901A2 and that a no-conductor-containing surface of the dielectric layer 902A2 abuts a no-conductor-containing surface of the dielectric layer 903A2.

At the second portion 631A, such structure allows each of the first transmission line including the signal conductor 214A, the second transmission line including the signal conductor 222A, and the third transmission line including the signal conductor 232A to define a stripline transmission line. Furthermore, by arranging the ground conductors between the signal conductors 214A, 222A, and 232A, which are provided on the same layer, the isolation is secured between the signal conductors 214A, 220A, and 230A, that is, the isolation between the first transmission line, the second transmission line, and the third transmission line. Based on the above, the thickness of the second portion 631A may be made as thin as possible.

As depicted in FIG. 7, the second portion 631A is arranged relative to the first portion 61A in such a way that the signal conductor 220A abuts the signal conductor 221A, the signal conductor 211A abuts the signal conductor 213A, the signal conductor 230A abuts the signal conductor 231A, and the ground conductors 3042, 3045, and 3047 abut the ground conductor 311A. Furthermore, the abutting conductors are joined to each other using solder and the like. This electrically and physically connects the first portion 61A and the second portion 631A.

Although it is not specifically described in the foregoing description, the thickness of each dielectric layer of the second portion 631A may be different from the thickness of each dielectric layer of the first portion 61A. Such configuration allows individual adjustments of the impedance of the transmission line provided at the first portion 61A and the impedance of the transmission line formed at the second portion 631A. This allows the first portion 61A and the second portion 631A to have desired impedances even if the thickness of the first portion 61A is different from the thickness of the second portion 631A.

Furthermore, a filter circuit may be provided at the second portion 631A. The filter circuit may be achieved with a conductor pattern provided on the second portion 631A or by installing a mounting type electronic component at the second portion 631A. Configuring the filter in this way allows securing of the isolation between the first transmission line, the second transmission line, and the third transmission line more reliably.

Figure 8:
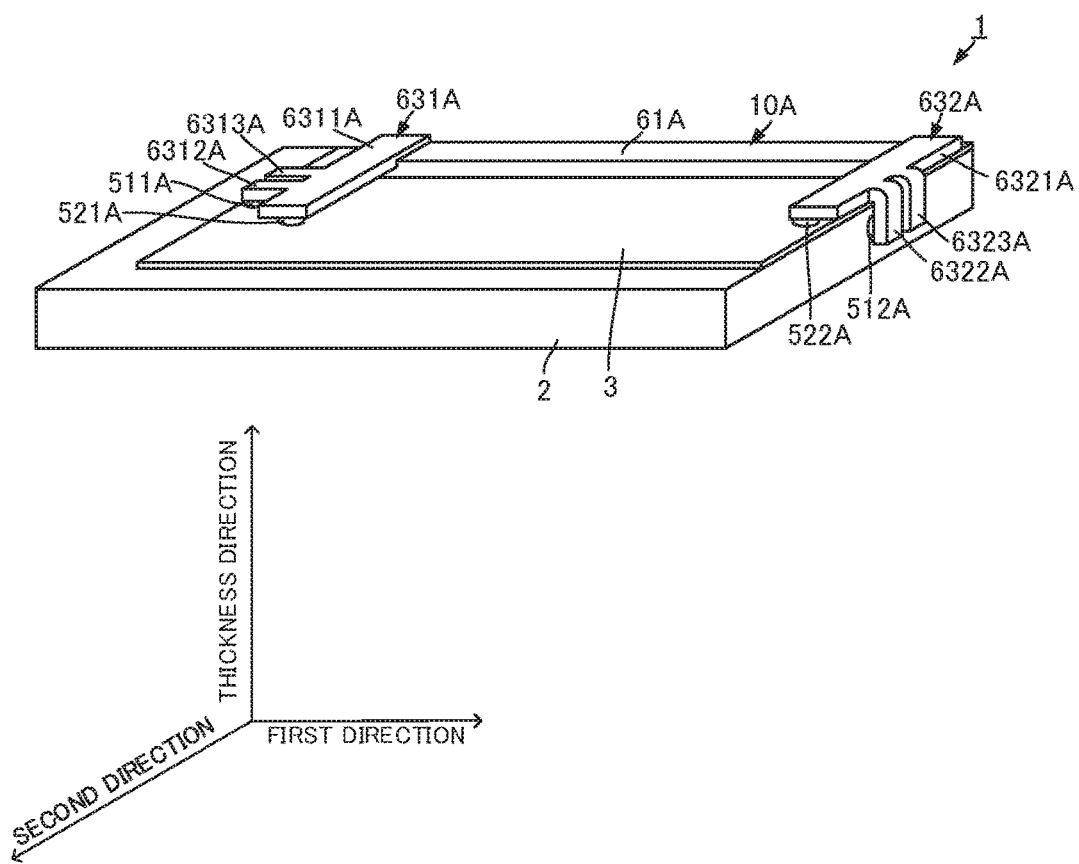
FIG. 8 is an external perspective view of an electronic component in which a transmission line according to the second preferred embodiment of the present invention is mounted.

The transmission line 10A having such a structure is mounted on an electronic component in the following manner. FIG. 8 is an external perspective view of an electronic component in which a transmission line according to the second preferred embodiment of the present invention is mounted.

An electronic component 1 includes an electronic device member 2, a circuit board 3, and a transmission line 10A. The circuit board 3 is installed on a first plane of the electronic device member 2. The first portion 61A and the second portion 631A of the transmission line 10A are located on the surface of the circuit board 3. The second portion 632A of the transmission line 10A is bended at the line members 6322A and 6323A. This allows the second portion 632A of the transmission line 10A to be arranged in such a way that the line member 6321A is on the surface of the circuit board 3 and that the line members 6322A and 6323A are arranged on a side of the electronic device member 2.

The connectors 511A, 521A, and 522A of the transmission line 10A are mounted on the circuit board. The connector 512A of the transmission line 10A is mounted on the electronic device member 2.

Using the transmission line 10A according to the present preferred embodiment in this way allows mounting of the transmission line 10A by bending only an end portion of the elongated direction. In this case, the thickness of the end portion in the elongated direction may be made thinner and the flexibility may be improved by using the transmission line 10A according to the present preferred embodiment, thus facilitating mounting of the transmission line 10A on the electronic device member 2.

Third Preferred Embodiment

Figure 9:
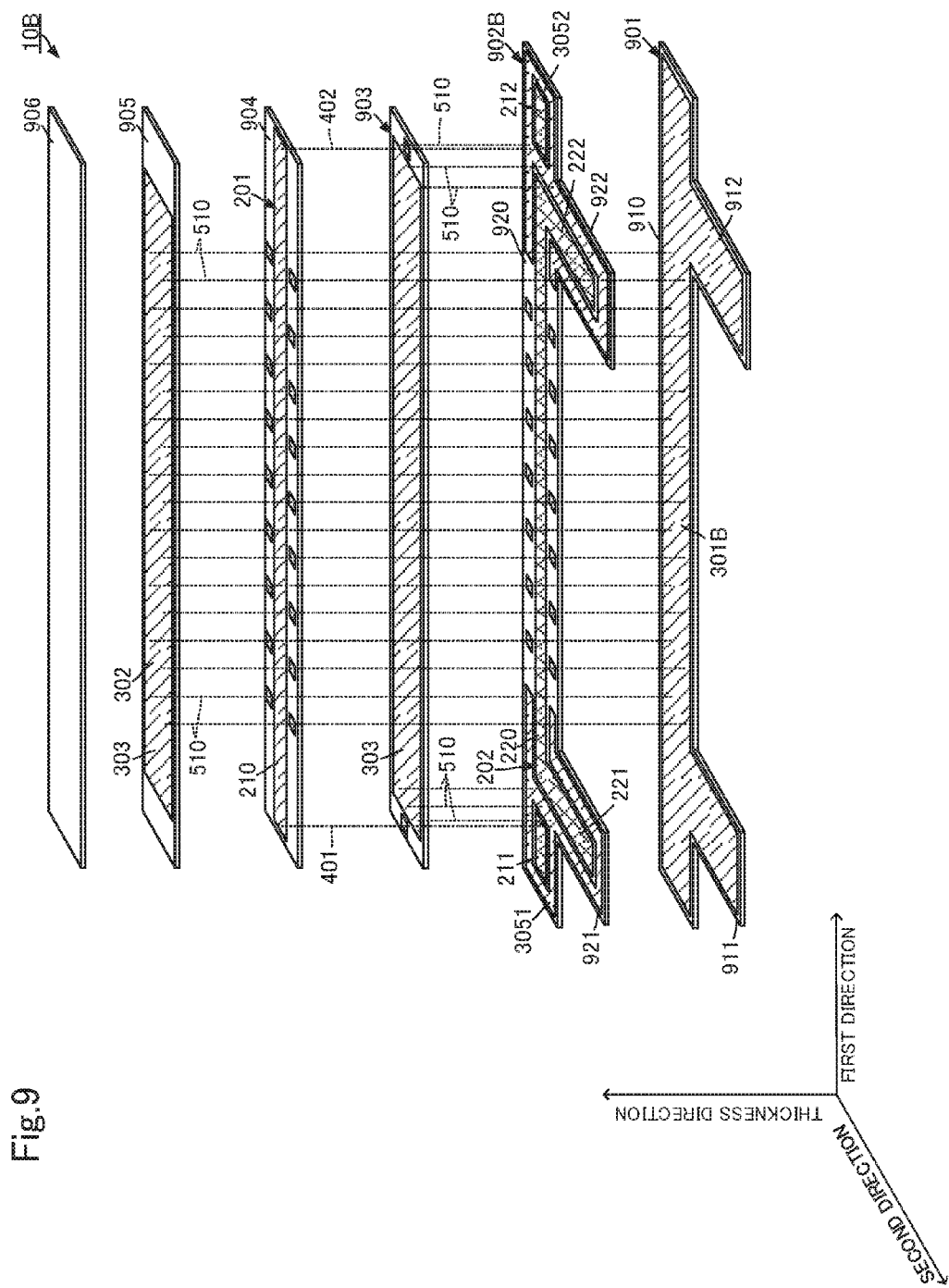
FIG. 9 is an external perspective view of a transmission line according to a third preferred embodiment of the present invention.

Next, a transmission line according to a third preferred embodiment of the present invention will be described with reference to drawings. FIG. 9 is an external perspective view of a transmission line according to the third preferred embodiment of the present invention.

A transmission line 10B according to the present preferred embodiment differs from the transmission line 10 according to the first preferred embodiment mainly in including additional ground conductors 3051 and 3052. Furthermore, the ground conductor 301B of the transmission line 10B differs from the ground conductor 301 according to the first preferred embodiment in that the ground conductor 301B is provided on substantially the entire area of the dielectric layer 901. In other words, the ground conductor 301B overlaps the signal conductors 211, 212, 221, and 222 and the ground conductors 3051 and 3052 in planar view in the thickness direction. This reliably suppresses high frequency noise radiation to external environment and noise coming from the external environment, thus providing a more preferable structure for the transmission line. Furthermore, the ground conductor 302 may also be provided on substantially the entire area of the dielectric layer 905.

The transmission line 10B includes the ground conductors 3051 and 3052. The ground conductors 3051 and 3052 are provided on the dielectric layer 902B. In other words, the ground conductors 3051 and 3052 are provided on the same layer with the signal conductors 211, 212, 220, 221, and 222. The ground conductor 3051 corresponds to a "fourth ground conductor", and the ground conductor 3052 corresponds to a "fifth ground conductor".

The ground conductor 3051 preferably has a shape surrounding the signal conductor 211. The shape of the ground conductor 3051 surrounds the signal conductor 221 except an end portion side of the signal conductor 221, which is connected to the signal conductor 220. The ground conductor 3051 preferably has a shape that sandwiches a predetermined length portion of the signal conductor 220, which is connected to the signal conductor 221, in the second direction.

The ground conductor 3052 preferably has a shape surrounding the signal conductor 212. The shape of the ground conductor 3052 surrounds the signal conductor 222 except an end portion side of the signal conductor 222, which is connected to the signal conductor 220. The shape of the ground conductor 3052 sandwiches a predetermined length portion of the signal conductor 220, which is connected to the signal conductor 222, in the second direction.

By using such structure, the ground of the end portions of the first signal conductor and the second signal conductor are strengthened. This significantly reduces or prevents crosstalk at the end portion (external connector portion).

Furthermore, by using such structure, the isolation between the first signal conductor and the second signal conductor may be improved even if the signal conductors 211 and 212 of the first signal conductor and the signal conductors 220, 221, and 222 of the second signal conductor are formed on the same layer.

As depicted in FIG. 9, a plurality of the interlayer connection conductors 510 are provided at a portion of the ground conductor 3051 interposed between the signal conductor 211 and the signal conductor 220 and at a portion of the ground conductor 3052 interposed between the signal conductor 212 and the signal conductor 220. These interlayer connection conductors correspond to a "third interlayer connection conductors". This further improves the isolation between the first signal conductor and the second signal conductor.

In such structure, it is preferred that a signal to be transmitted in the second signal conductor is a high frequency signal and a signal to be transmitted in the first signal conductor is a low frequency signal. This significantly reduces or prevents an influence of the inductance of the interlayer connection conductors on the high frequency signal being transmitted in the second signal conductor, thus improving transmission characteristics. Furthermore, since the entire portion of the second signal conductor is surrounded by the ground conductor, leakage of the high frequency signal to outside is significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line comprising:
a dielectric base body including a plurality of dielectric layers stacked in a stacking direction;
a first signal conductor and a second signal conductor that are disposed in the dielectric base body and transmit high frequency signals; and
a first ground conductor; wherein
the first signal conductor includes a first signal main conductor portion, a first end portion connected to one end of the first signal main conductor portion, and a second end portion connected to another end of the first signal main conductor portion;
the second signal conductor includes a second signal main conductor portion, a third end portion connected to one end of the second signal main conductor portion, and a fourth end portion connected to another end of the second signal main conductor portion;
the second signal main conductor portion lines up with the first signal main conductor portion at a layer position different from a layer position of the first signal main conductor portion in the stacking direction;
the third end portion and the first end portion are provided at a same layer in the stacking direction;
the first end portion and the first signal main conductor portion are provided at different layer positions in the stacking direction and connected to each other;
the first ground conductor is located between the first signal main conductor portion and the second signal main conductor portion in the stacking direction and has a width wider than widths of the first signal main conductor portion and the second signal main conductor portion; and
the first end portion and the first signal main conductor portion are connected by capacitive coupling.

2. The transmission line according to claim 1, further comprising:
at least one of:
a second ground conductor disposed on a side opposite to the first ground conductor with reference to the first signal main conductor portion in the stacking direction; and
a third ground conductor disposed on a side opposite to the first ground conductor with reference to the second signal main conductor portion in the stacking direction.

3. The transmission line according to claim 1, further comprising a first connector connected to the first signal conductor and a second connector connected to the second signal conductor.

4. A transmission line comprising:
a dielectric base body including a plurality of dielectric layers stacked in a stacking direction;
a first signal conductor and a second signal conductor that are disposed in the dielectric base body and transmit high frequency signals; and
a first ground conductor; wherein
the first signal conductor includes a first signal main conductor portion, a first end portion connected to one end of the first signal main conductor portion, and a second end portion connected to another end of the first signal main conductor portion;
the second signal conductor includes a second signal main conductor portion, a third end portion connected to one end of the second signal main conductor portion, and a fourth end portion connected to another end of the second signal main conductor portion;
the second signal main conductor portion lines up with the first signal main conductor portion at a layer position different from a layer position of the first signal main conductor portion in the stacking direction;
the third end portion and the first end portion are provided at a same layer in the stacking direction;
the first end portion and the first signal main conductor portion are provided at different layer positions in the stacking direction and connected to each other;
the first ground conductor is located between the first signal main conductor portion and the second signal main conductor portion in the stacking direction and has a width wider than widths of the first signal main conductor portion and the second signal main conductor portion;
the transmission line further comprises a first interlayer connection conductor that connects the first end portion and the first signal main conductor portion;
the second signal main conductor portion, the third end portion, the fourth end portion, the first end portion of the first signal conductor, and the second end portion of the first signal conductor are provided at a same layer in the stacking direction; and
the second end portion and the first signal main conductor portion are connected to each other by a second interlayer connection conductor.

5. The transmission line according to claim 4, further comprising:
at least one of:
a second ground conductor disposed on a side opposite to the first ground conductor with reference to the first signal main conductor portion in the stacking direction; and
a third ground conductor disposed on a side opposite to the first ground conductor with reference to the second signal main conductor portion in the stacking direction.

6. The transmission line according to claim 4, further comprising a first connector connected to the first signal conductor and a second connector connected to the second signal conductor.

7. The transmission line according to claim 4, further comprising:
a fourth ground conductor located between the first end portion and the second signal main conductor portion; and
a fifth ground conductor located between the second end portion and the second signal main conductor portion.

8. The transmission line according to claim 7, further comprising:

a third interlayer connection conductor that connects the first ground conductor and the fourth ground conductor or the fifth ground conductor; wherein the fourth ground conductor surrounds the first end portion; and the fifth ground conductor surrounds the second end portion.

9. The transmission line according to claim 8, wherein the fourth ground conductor surrounds the third end portion; and the fifth ground conductor surrounds the fourth end portion.

10. A transmission line comprising:

a dielectric base body including a plurality of dielectric layers stacked in a stacking direction;

a first signal conductor and a second signal conductor that are disposed in the dielectric base body and transmit high frequency signals; and a first ground conductor; wherein the first signal conductor includes a first signal main conductor portion, a first end portion connected to one end of the first signal main conductor portion, and a second end portion connected to another end of the first signal main conductor portion;

the second signal conductor includes a second signal main conductor portion, a third end portion connected to one end of the second signal main conductor portion, and a fourth end portion connected to another end of the second signal main conductor portion;

the second signal main conductor portion lines up with the first signal main conductor portion at a layer position different from a layer position of the first signal main conductor portion in the stacking direction;

the third end portion and the first end portion are provided at a same layer in the stacking direction;

the first end portion and the first signal main conductor portion are provided at different layer positions in the stacking direction and connected to each other;

the first ground conductor is located between the first signal main conductor portion and the second signal main conductor portion in the stacking direction and has a width wider than widths of the first signal main conductor portion and the second signal main conductor portion;

the dielectric base body includes:

a first portion where the first signal main conductor portion overlaps the second signal main conductor portion in the stacking direction; and a second portion where the first end portion, the second end portion, the third end portion, and the fourth end portion are disposed; and the second portion includes at least a portion with a thickness in the stacking direction that is thinner than a thickness of the first portion.

11. The transmission line according to claim 10, further comprising:

a third signal conductor provided at a same layer position as that of the second signal main conductor portion in the stacking direction; wherein the second signal main conductor portion, the third end portion, and the fourth end portion are provided at a same layer position in the stacking direction; and in-layer ground conductors are provided between the third signal conductor and the second signal main conductor portion at the first portion, between the third signal conductor and the first end portion and the third end portion at the second portion, and between the third signal conductor and the second end portion and the fourth end portion at the second portion.

12. The transmission line according to claim 10, wherein at the first portion and the second portion, at least a portion of the plurality of dielectric layers including an insulating base material having a different thickness.

13. The transmission line according to claim 10, further comprising:

at least one of:

a second ground conductor disposed on a side opposite to the first ground conductor with reference to the first signal main conductor portion in the stacking direction; and a third ground conductor disposed on a side opposite to the first ground conductor with reference to the second signal main conductor portion in the stacking direction.

14. The transmission line according to claim 10, further comprising a first connector connected to the first signal conductor and a second connector connected to the second signal conductor.

15. A transmission line comprising:

a dielectric base body including a plurality of dielectric layers stacked in a stacking direction;

a first signal conductor and a second signal conductor that are disposed in the dielectric base body and transmit high frequency signals; and a first ground conductor; wherein the first signal conductor includes a first signal main conductor portion, a first end portion connected to one end of the first signal main conductor portion, and a second end portion connected to another end of the first signal main conductor portion;

the second signal conductor includes a second signal main conductor portion, a third end portion connected to one end of the second signal main conductor portion, and a fourth end portion connected to another end of the second signal main conductor portion;

the second signal main conductor portion lines up with the first signal main conductor portion at a layer position different from a layer position of the first signal main conductor portion in the stacking direction;

the third end portion and the first end portion are provided at a same layer in the stacking direction;

the first end portion and the first signal main conductor portion are provided at different layer positions in the stacking direction and connected to each other; and the first ground conductor is located between the first signal main conductor portion and the second signal main conductor portion in the stacking direction and has a width wider than widths of the first signal main conductor portion and the second signal main conductor portion; and the transmission line further comprises a fourth ground conductor arranged between the first end portion and the second signal main conductor portion.

16. The transmission line according to claim 15, wherein the fourth ground conductor surrounds the first end portion.

17. The transmission line according to claim 15, further comprising:

at least one of:

a second ground conductor disposed on a side opposite to the first ground conductor with reference to the first signal main conductor portion in the stacking direction; and a third ground conductor disposed on a side opposite to the first ground conductor with reference to the second signal main conductor portion in the stacking direction.

18. The transmission line according to claim 15, further comprising a first connector connected to the first signal conductor and a second connector connected to the second signal conductor.

19. A transmission line comprising:
a dielectric base body including a plurality of dielectric layers stacked in a stacking direction;
a first signal conductor and a second signal conductor that are disposed in the dielectric base body and transmit high frequency signals; and
a first ground conductor; wherein
the first signal conductor includes a first signal main conductor portion, a first end portion connected to one end of the first signal main conductor portion, and a second end portion connected to another end of the first signal main conductor portion;
the second signal conductor includes a second signal main conductor portion, a third end portion connected to one end of the second signal main conductor portion, and a fourth end portion connected to another end of the second signal main conductor portion;
the second signal main conductor portion lines up with the first signal main conductor portion at a layer position different from a layer position of the first signal main conductor portion in the stacking direction;
the third end portion and the first end portion are provided at a same layer in the stacking direction;
the first end portion and the first signal main conductor portion are provided at different layer positions in the stacking direction and connected to each other;
the first ground conductor is located between the first signal main conductor portion and the second signal main conductor portion in the stacking direction and has a width wider than widths of the first signal main conductor portion and the second signal main conductor portion;
the first signal conductor defines a first transmission line and the second signal conductor defines a second transmission line; and
the second transmission line does not include any interlayer connection conductors.

* * * * *